US012808045B2

(12) United States Patent
Dhamankar et al.

(10) Patent No.: US 12,808,045 B2
(45) Date of Patent: Nov. 24, 2026

(54) CHEMICAL VAPOR INFILTRATION APPARATUS AND ASSEMBLY FOR GAS INFLOW IN REACTION CHAMBER

(71) Applicant: Zimmer, Inc., Warsaw, IN (US)

(72) Inventors: Akshay Vinayak Dhamankar, Parsippany, NJ (US); Sheng Ma, Wayne, NJ (US); Edward M. Willis, Hoboken, NJ (US)

(73) Assignee: Zimmer, Inc., Warsaw, IN (US)

( * ) Notice: Subject to any disclaimer, the term of this patent is extended or adjusted under 35 U.S.C. 154(b) by 898 days.

(21) Appl. No.: 18/100,238

(22) Filed: Jan. 23, 2023

(65) Prior Publication Data

US 2023/0235456 A1 Jul. 27, 2023

Related U.S. Application Data

(60) Provisional application No. 63/303,695, filed on Jan. 27, 2022.

(51) Int. Cl.
*C23C 16/455* (2006.01)
*H01J 37/32* (2006.01)

(52) U.S. Cl.
CPC .. *C23C 16/45512* (2013.01); *C23C 16/45561* (2013.01); *C23C 16/45587* (2013.01);
(Continued)

(58) Field of Classification Search
CPC ........ C23C 16/44512; C23C 16/45561; C23C 16/45587; C23C 16/08; C23C 16/14;
(Continued)

(56) References Cited

U.S. PATENT DOCUMENTS 5,282,861 A * 2/1994 Kaplan .................. B22F 3/114 623/23.51
8,956,683 B2 2/2015 Vargas et al.
9,277,998 B2 3/2016 Vargas et al.

FOREIGN PATENT DOCUMENTS

AU 2023200191 5/2024
DE 102013113817 A1 * 6/2014 ....... C23C 16/45512
(Continued)

OTHER PUBLICATIONS

Machine Translation JP-2000273634 (Year: 2000).*
(Continued)

*Primary Examiner* — Rodney G Mcdonald
(74) *Attorney, Agent, or Firm* — SCHWEGMAN LUNDERBERG & WOESSNER, P.A.

(57) ABSTRACT

An apparatus for use in a chemical vapor infiltration process is disclosed. The apparatus can optionally include any one or combination of a first reaction chamber, a mixing chamber and a second reaction chamber. The mixing chamber can have at least a first inlet, a second inlet and an outlet. The first inlet can be in fluid communication with the first reaction chamber and receive a second precursor gas. The second inlet can be in fluid communication to receive a third precursor gas. The second precursor gas and the third precursor gas can mix within the mixing chamber before passing to the outlet and into the second reaction chamber. The second reaction chamber can contain a substrate that can receive a film deposition from reaction of the second precursor gas and the third precursor gas within the second reaction chamber.

12 Claims, 7 Drawing Sheets

(52) U.S. Cl.
CPC .... *H01J 37/3244* (2013.01); *H01J 37/32449* (2013.01); *H01J 37/32458* (2013.01)

(58) Field of Classification Search
CPC . C23C 16/4488; C23C 16/045; A61F 2/3094; A61F 2002/2835; H01J 37/3244; H01J 37/32449; H01J 37/32458
USPC .......................................................... 118/715
See application file for complete search history.

(56) References Cited

FOREIGN PATENT DOCUMENTS

| | | | | | |
|---|---|---|---|---|---|
| EP | 4219789 | | 8/2023 | | |
| JP | 2000273634 A | * | 10/2000 | ............. | C23C 16/08 |
| KR | 102220683 B1 | * | 2/2021 | ............. | F16C 19/08 |

OTHER PUBLICATIONS

Machine Translation KR-102220683 (Year: 2021).*
Machine Translation DE 102013113817 A1 (Year: 2014).*
"European Application Serial No. 23153745.7, Extended European Search Report mailed Jun. 5, 2023", 6 pgs.
"Australian Application Serial No. 2023200191, First Examination Report mailed Oct. 9, 2023", 3 pgs.
"European Application Serial No. 23153745.7, Response filed Jan. 19, 2024 to Extended European Search Report mailed Jun. 5, 2023", 8 pgs.
"Australian Application Serial No. 2023200191, Response Filed Dec. 20, 2023 to First Examination Report mailed Oct. 9, 2023", 2 pgs.
"Canadian Application Serial No. 3,187,109, Examiners Rule 862 Report mailed Apr. 19, 2024", 3 pgs.
"European Application Serial No. 23153745.7, Communication Pursuant to Article 943 EPC mailed May 6, 2024", 4 pgs.
"European Application Serial No. 23153745.7, Response filed Aug. 8, 2024 to Communication Pursuant to Article 943 EPC mailed May 6, 2024", 18 pgs.
"Canadian Application Serial No. 3,187,109, Response filed Aug. 16, 2024 to Examiners Rule 862 Report mailed Apr. 19, 2024", 5 pgs.
"Canadian Application Serial No. 3,187,109, Office Action mailed Jan. 21, 2025", 3 pgs.
"Canadian Application Serial No. 3,187,109, Response filed May 7, 2025 to Office Action mailed Jan. 21, 2025", 14 pgs.
Levine, Brett R, et al., "Experimental and clinical performance of porous tantalum in orthopedic surgery", Biomaterials, (27), (Sep. 2006), 4671-81.

* cited by examiner

CHEMICAL VAPOR INFILTRATION APPARATUS AND ASSEMBLY FOR GAS INFLOW IN REACTION CHAMBER

CLAIM OF PRIORITY

This application claims the benefit of U.S. Provisional Patent Application Ser. No. 63/303,695, filed on Jan. 27, 2022, the benefit of priority of which is claimed hereby, and which is incorporated by reference herein in its entirety.

TECHNICAL FIELD

The present application relates to chemical vapor infiltration (CVI) processes, and more particularly, to CVI apparatuses and components thereof used in depositing a biocompatible material onto a porous implant in the CVI process.

BACKGROUND

Orthopedic implants may be constructed of, or coated with, porous biomaterial to encourage bone growth into the implant. The need for cancellous bone substitute and/or cell and tissue receptive material is significant. Bone ingrowth into the voids of a porous material provides ideal skeletal fixation for permanent implants used for the replacement of bone segments damaged or lost due to any number of reasons, or for joint prostheses in some instances. Biological compatibility, intimate contact with the surrounding bone, and adequate stability during the early period of bone ingrowth have been identified as important requirements, along with proper porosity. One example of such material with biological compatibility and other traits is a porous tantalum metal or metal alloy, produced using Trabecular Metal™ technology generally available from Zimmer Biomet, Inc., of Warsaw, Ind. Trabecular Metal™ is a trademark of Zimmer Biomet, Inc.

Processes for forming porous bio-compatible materials are known. In one such process, reticulated open cell carbon foam is infiltrated with a metal or metal alloy (e.g., tantalum, tantalum alloys, etc.) by a chemical vapor infiltration (CVI) (sometimes also referred to as chemical vapor deposition (CVD)) process. The resulting lightweight, strong, porous structure, mimics the microstructure of natural cancellous bone, and acts as a matrix for the incorporation of bone or reception of cells and tissue. Although this technique has proven to be very effective, in some instances, deposition of the metal can be uneven and/or deposition efficiency may be lower than desired. This can be due to lack of adequate mixing of gases used for the infiltration. Thus, portions of the carbon foam or porous metal can be over-densified or under-densified relative to a desired density. In some cases, these portions are removed necessitating additional processing steps and time.

OVERVIEW

The present inventors recognize, among other things, an opportunity to distribute gases so as to mix more uniformly during the CVI process. More particularly, the present inventors recognize that a separate mixing chamber in addition to the reaction chamber can facilitate mixing of precursor gases more uniformly with the result being a higher reaction efficiency. The more thoroughly mixed precursor gases can then enter the reaction chamber to react and infiltrate substrates. This better mixing of the precursor gases results in a higher reaction efficiency and helps achieve a more uniform density profile within and along the substrate. Although described in reference to CVI processes that utilize a metal or metal alloy (e.g., tantalum or tantalum alloy) in a precursor gas and a reticulated open cell carbon foam or porous metal substrate, the principles can be utilized for other CVI/CVD processes where a more uniform distribution of precursor gas is desirable.

The present inventors further recognize various apparatus configurations for the CVI apparatus and mixing chamber that can facilitate a higher efficiency reaction of the precursor gases due to better mixing. Other advantages are also realized. The CVI apparatus can have two reaction chambers separate from one another. The CVI apparatus can be configured to facilitate changing the inlets) location for a third gas (sometimes also referred to as "third precursor gas", such as hydrogen gas ($H_2$)) relative to a second gas (sometimes referred to as "second precursor gas", such as tantalum pentachloride ($TaCl_5$)). The present inventors additionally recognize a modular configuration for the CVI apparatuses that allows for a rapid change of inlet(s) location. The present inventors further recognize that the CVI apparatuses disclosed herein can facilitate the manufacture of medical implants, and permit the fabrication of load-bearing substrates with high or low density coating as desired. Post fabrication processing can thereby be reduced, saving time and cost.

To further illustrate apparatuses and methods disclosed herein, a non-limiting list of examples is provided here:

Example 1 is an apparatus for use in a chemical vapor infiltration process. The apparatus can optionally include any one or combination of a first reaction chamber, a mixing chamber and a second reaction chamber. The first reaction chamber can have an inlet configured to receive a first gas and can have outlet therefrom for a second gas reacted in the first reaction chamber. The mixing chamber can have an inlet in fluid communication with the outlet of the first reaction chamber. The mixing chamber can have one or more second inlets thereto configured to receive a third gas, the mixing chamber can have an outlet therefrom. The second reaction chamber can have an inlet in fluid communication with the outlet of the mixing chamber to receive a mixture of the second gas and the third gas therein. The second reaction chamber can be configured to hold a substrate therein that is coated by reaction of the second gas and the third gas within the second reaction chamber.

Example 2 is the apparatus of Example 1, wherein optionally the first reaction chamber has a frustoconical shape with a first cross-sectional area adjacent the outlet that is relatively smaller as compared with a second cross-sectional area adjacent the inlet.

Example 3 is the apparatus of any one of Examples 1-2, wherein optionally the one or more second inlets include one or more inlets through a side wall of the mixing chamber and/or one or more inlets through an end wall of the mixing chamber.

Example 4 is the apparatus of Example 3, wherein optionally the mixing chamber includes one or more vortex inducing features therein in fluid communication with the one or more inlets through the side wall.

Example 5 is the apparatus of Example 4, wherein optionally an interior of the side wall of the mixing chamber includes the one or more vortex inducing features.

Example 6 is the apparatus of any of Examples 3-5, wherein optionally the one or more inlets through the side wall of the mixing chamber and one or more inlets through the end wall of the mixing chamber are selectively closeable.

Example 7 is the apparatus of any one of Examples 1-6, wherein optionally the outlet of the mixing chamber has a flange and is tapered to have reduced cross-sectional area at an exit of the outlet.

Example 8 is an apparatus for use in a chemical vapor infiltration process. The apparatus can optionally include any one or any combination of a first reaction chamber, a mixing chamber and a second reaction chamber. The first reaction chamber can be configured to receive a first precursor gas and hold a biocompatible material. The first precursor gas and the biocompatible material can react within the first reaction chamber to form a second precursor gas. The mixing chamber can have at least a first inlet, a second inlet and an outlet. The first inlet can be in fluid communication with the first reaction chamber to receive the second precursor gas from the first reaction chamber and the second inlet can be in fluid communication to receive a third precursor gas. The second precursor gas and the third precursor gas can mix within the mixing chamber before passing to the outlet. The second reaction chamber can be configured to receive the second precursor gas and the third precursor gas mix and can have a pedestal to hold a substrate therein. The substrate can receive a film deposition from reaction of the second precursor gas and the third precursor gas within the second reaction chamber.

Example 9 is the apparatus of Example 8, wherein optionally the mixing chamber adjacent the outlet is tapered with a flange and has a first cross-sectional area at an exit of the outlet that is relatively smaller than a second cross-sectional area spaced from the exit.

Example 10 is the apparatus of any one of Examples 8-9, wherein optionally the first reaction chamber has a frustoconical shape with a first cross-sectional area adjacent the outlet that is relatively smaller as compared with a second cross-sectional area adjacent the inlet.

Example 11 is the apparatus of any one of Examples 8-10, wherein optionally the second inlet includes one or more inlets through a side wall of the mixing chamber and/or one or more inlets through an end wall of the mixing chamber.

Example 12 is the apparatus of Example 11, wherein optionally the mixing chamber includes one or more vortex inducing features therein in fluid communication with the one or more inlets through the side wall.

Example 13 is the apparatus of any one of Examples 8-12, wherein optionally the substrate comprises a reticulated carbon foam or porous metal.

Example 14 is the apparatus of any one of Examples 8-13, wherein optionally the second precursor gas includes a tantalum or tantalum alloy.

Example 14 is a chemical vapor deposition method. The method can include any one or any combination of: reacting a first precursor gas with a biocompatible material to form a second precursor gas in a first chamber, mixing the second precursor gas with a third precursor gas in a second chamber, reacting the second precursor gas with the third precursor gas after the mixing in a third chamber, and depositing a film deposition on a substrate within the third chamber as a result of the reacting the second precursor gas with the third precursor gas.

Example 16 is the method of Example 15, wherein optionally the substrate comprises a reticulated carbon foam or porous metal structure having a porosity of between 55% and 90%.

Example 17 is the method of any one of Examples 15-16, wherein optionally the second precursor gas includes a tantalum or tantalum alloy.

Example 18 is the method of any one of Examples 15-17, wherein optionally mixing the second precursor gas with the third precursor gas optionally includes creating a vortex of a flow of the third precursor gas upon entry into the second chamber.

Example 19 is the method of any one of Examples 15-18, wherein optionally mixing the second precursor gas with the third precursor gas optionally includes passing the second precursor gas and the third precursor gas through one or more a turbulent flow inducing structures at an outlet from the second mixing chamber.

Example 20 is the method of any one of Examples 15-19, wherein optionally mixing the second precursor gas with the third precursor gas optionally includes passing the third precursor gas through one or more inlets through a side wall of the second chamber.

In Example 21, the apparatuses or method of any one or any combination of Examples 1-20 can optionally be configured such that all elements or combinations of elements or options recited are available to use or select from.

These and other examples and features of the present apparatuses and methods will be set forth in part in the following Detailed Description. This Overview is intended to provide non-limiting examples of the present subject matter—it is not intended to provide an exclusive or exhaustive explanation. The Detailed Description below is included to provide further information about the present apparatus, systems and methods.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
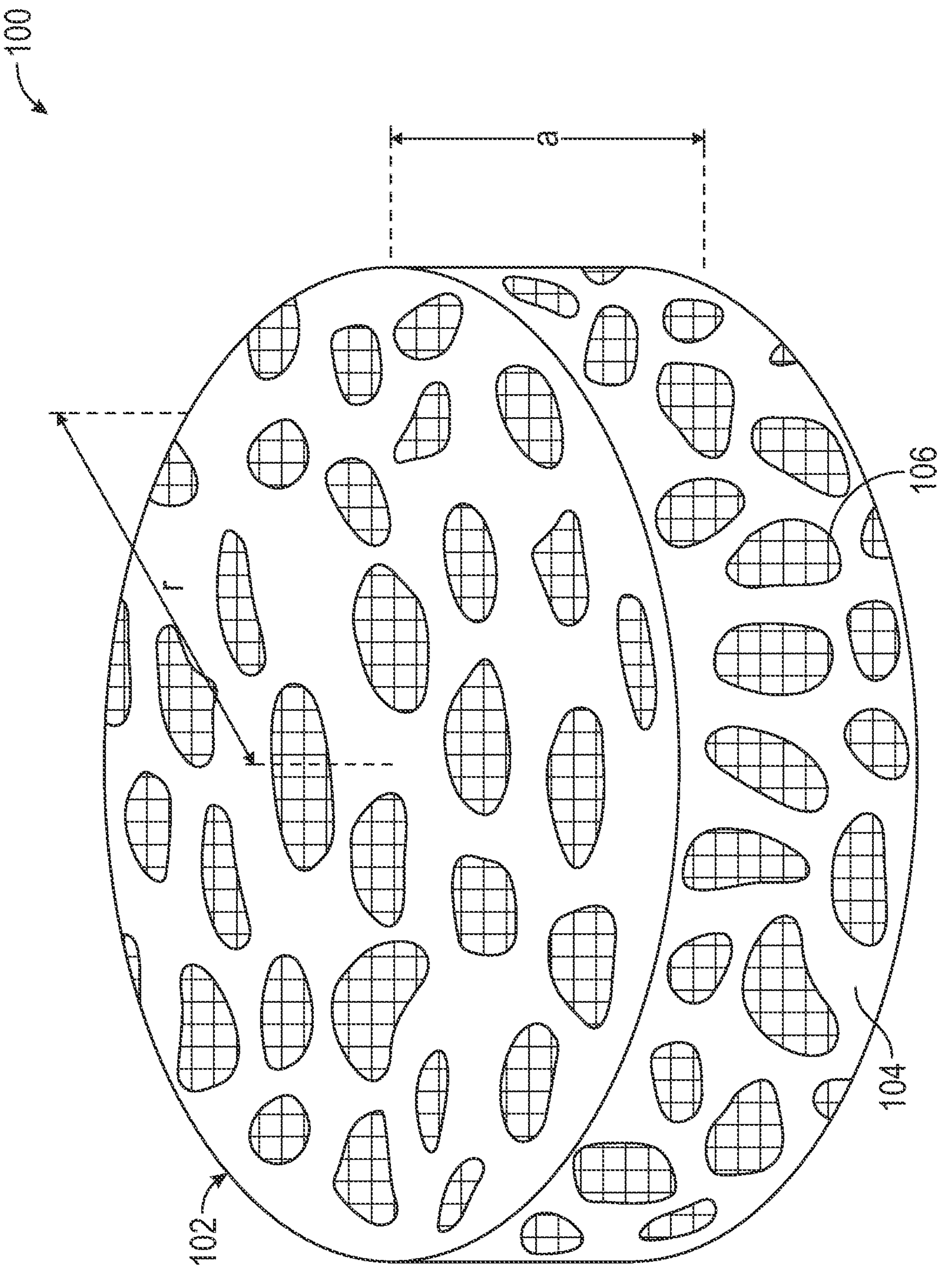
FIG. 1 a perspective view of a porous metal structure, according to an example of the present disclosure.

The present application relates to apparatuses and their use in CVI)/CVI processes. As previously discussed, the apparatuses disclosed herein contemplate the use of a dedicated mixing chamber for mixing of two or more precursor gases prior to entering a reaction chamber. Use of this mixing chamber can improve mixing of the gases and can result in a higher reaction efficiency, FIG. 1 illustrates an exemplary configuration of porous metal implant structure 100. As illustrated in FIG. 1, the porous implant 100 can comprise a disk, cup or other structure having a substrate 102 of highly porous material having a radius r and an axial thickness a. The porosity of the porous material can be between 55% and 90%, although other porosities are also contemplated. A size and dimensions of the porous implant 100 can be determined based on the desired size of the objects (orthopedic implants, etc.) created therefrom among other factors. Because the substrate 102 is porous, the substrate 102 can promote bone ingrowth and fusion in some circumstances, as further described below.

The substrate 102 can include a plurality of ligaments 104 defining a plurality of highly interconnected, three-dimensional open spaces or pores 106 (highly exaggerated in FIG. 1) therebetween. The substrate 102 can incorporate one or more of a variety of biocompatible metals as a coating thereon. Such structures are particularly suited for contacting bone and soft tissue, and in this regard, can be useful as a bone substitute and as cell and tissue receptive material, for example, by allowing tissue to grow into the porous structure over time to enhance fixation (e.g., osseointegration) between the structure and surrounding bodily structures.

According to certain examples of the present disclosure, the porous implant 100 can have a porosity as low as 55%, 65%, or 75% or as high as 80%, 85%, or 90%, or within any range defined between any pair of the foregoing values. As will be discussed in further detail, the porous implant 100 can be formed from a reticulated vitreous carbon foam substrate, metal substrate, porous metal substrate or other material substrate which is infiltrated and coated with a biocompatible metal, such as tantalum, by a CVD process (also called a CVI process herein). Such a CVI) process is disclosed in detail in U.S. Pat. No. 5,282,861, in Levine, B. R., et al., "Experimental and Clinical Performance of Porous Tantalum in Orthopedic Surgery", Biomaterials 27 (2006) 4671-4681, and U.S. Pat. Nos. 9,277,998 and 8,956,683, the disclosures of which are expressly incorporated herein by reference in their entirety. In addition to or alternative to tantalum, other biocompatible metals may also be used in the formation of the highly porous metal structure such as the coating. These biocompatible materials include titanium, a titanium alloy, cobalt chromium, cobalt chromium molybdenum, tantalum, a tantalum alloy, niobium, or alloys of tantalum and niobium with one another or with other metals such as those discussed previously. It is also within the scope of the present disclosure for the porous implant 100 to be in the form of a fiber metal pad or a sintered metal layer, such as a Cancellous-Structured Titanium™ (CSTi™) layer. CSTi™ porous layers are manufactured by Zimmer Biomet, Inc., of Warsaw, Ind. Cancellous-Structured Titanium™ and CSTi™ are trademarks of Zimmer Biomet, Inc.

Generally, the porous implant 100 will include the plurality of metallic ligaments 104 defining open pores 106 (e.g., voids) or channels therebetween. The open spaces between the ligaments form a matrix of continuous channels having few or no dead ends, such that growth of soft tissue and/or bone through open porous metal is substantially uninhibited. Thus, the porous implant 100 can provide a lightweight, strong porous structure which is substantially uniform and consistent in composition, and provides a matrix (e.g., closely resembling the structure of natural cancellous bone) into which soft tissue and bone may grow to provide fixation of the implant to surrounding bodily structures.

The porous implant 100 may also be fabricated such that it comprises a variety of densities in order to selectively tailor the structure for particular orthopedic applications. In particular, the porous implant 100 may be fabricated to virtually any desired density, porosity, and pore size (e.g., pore diameter), and can thus be matched with the surrounding natural tissue in order to provide an improved matrix for tissue ingrowth and mineralization. According to certain examples, the porous implant 100 can be fabricated to have a substantially uniform porosity, density, and/or void (pore) size throughout, or to comprise at least one of pore size, porosity, and/or density being varied within the structure. For example, the porous implant 100 may have a different pore size and/or porosity at different regions, layers, and surfaces of the structure. The ability to selectively tailor the structural properties of the porous implant 100, for example, enables tailoring of the structure for distributing stress loads throughout the surrounding tissue and promoting specific tissue ingrown within the porous implant 100.

With a reticulated vitreous carbon (RVC) substrate, polymer foam material can be converted into the RVC substrate by first impregnating the polymer foam with a carbonaceous resin and then heating the impregnated foam to a suitable pyrolysis temperature, on the order of 800° C.-2000° C., to convert the polymer foam and any carbonaceous resin into vitreous carbon having individual carbon foam ligaments. The RVC may be shaped into the final form of the orthopedic implant using machining or other shaping techniques. Using CVI, a biocompatible material, such as tantalum, niobium, tungsten, alloys thereof, or other metal(s) previously discussed may then be coated onto the RVC substrates in a heated reaction chamber. For example, in order to deposit tantalum onto the RVC substrates, solid tantalum metal (Ta) is heated to react with chlorine gas ($Cl_2$) to form tantalum chloride gas, such as tantalum pentachloride ($TaCl_5$), for example. The tantalum chloride gas flows into the reaction chamber and is mixed with hydrogen gas ($H_2$). Upon contact with the heated surface of the substrates, as shown in Equation 1 below, tantalum metal deposits onto the substrates in a thin film over the individual ligaments of the substrates and the hydrogen and chlorine gases react to form hydrogen chloride gas (HCl), which is exhausted from the reaction chamber via one or more outlets.

$$TaCl_5+5/2H_2 \rightarrow Ta+5HCl \quad \text{Equation 1:}$$

This CVI cycle may be repeated, with the positions of the substrates in the reaction chamber varied, until the substrates are uniformly coated with tantalum. Following each CVI cycle, the hydrogen chloride gas byproduct and any non-converted tantalum chloride gas may react with water and aqueous sodium hydroxide solution to precipitate tantalum oxide, sodium chloride, and water, as is shown in Equation 2.

$$2HCl_{(g)}+2TaCl_{5(g)}+H_2O_{(l)}+12NaOH_{(aq)} \rightarrow Ta_2O_{5(g)}+12NaCl_{(aq)}+8H_2O_{(l)} \quad \text{Equation 2:}$$

Figure 2:
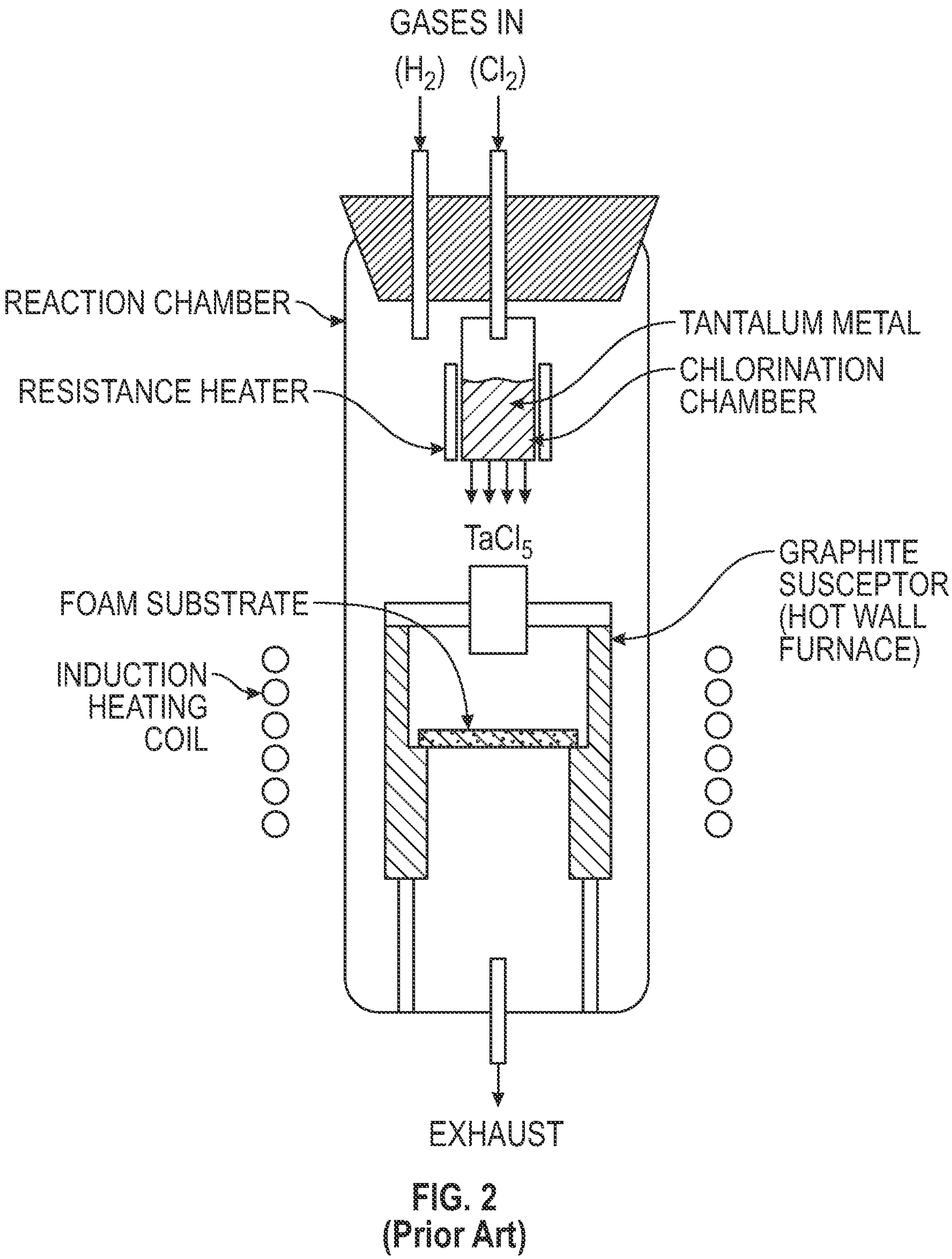
FIG. 2 (Prior Art)
FIG. 2 is a schematic illustration of a prior art apparatus for CVI.

FIG. 2 is a schematic view of an apparatus for CVI as known in the art. The apparatus shows a single reaction chamber as known. It is known to place solid tantalum, in the form of nuggets or other scrap tantalum, within a holding device of a chlorination chamber within the single reaction chamber with a holding device positioned above the substrate. As such, chlorine gas ($Cl_2$) and solid tantalum react within the heated chlorination chamber to form gaseous tantalum pentachloride ($TaCl_5$), which flows in a downward direction toward the substrate. However, one potential problem with this arrangement is that hydrogen gas ($H_2$) may not mix adequately with the gaseous tantalum pentachloride ($TaCl_5$). This lack of mixing reduces reaction efficiency. Inadequate mixing of the gases can also result in uneven deposition of tantalum (or other biocompatible material) on the substrate.

Figure 3:
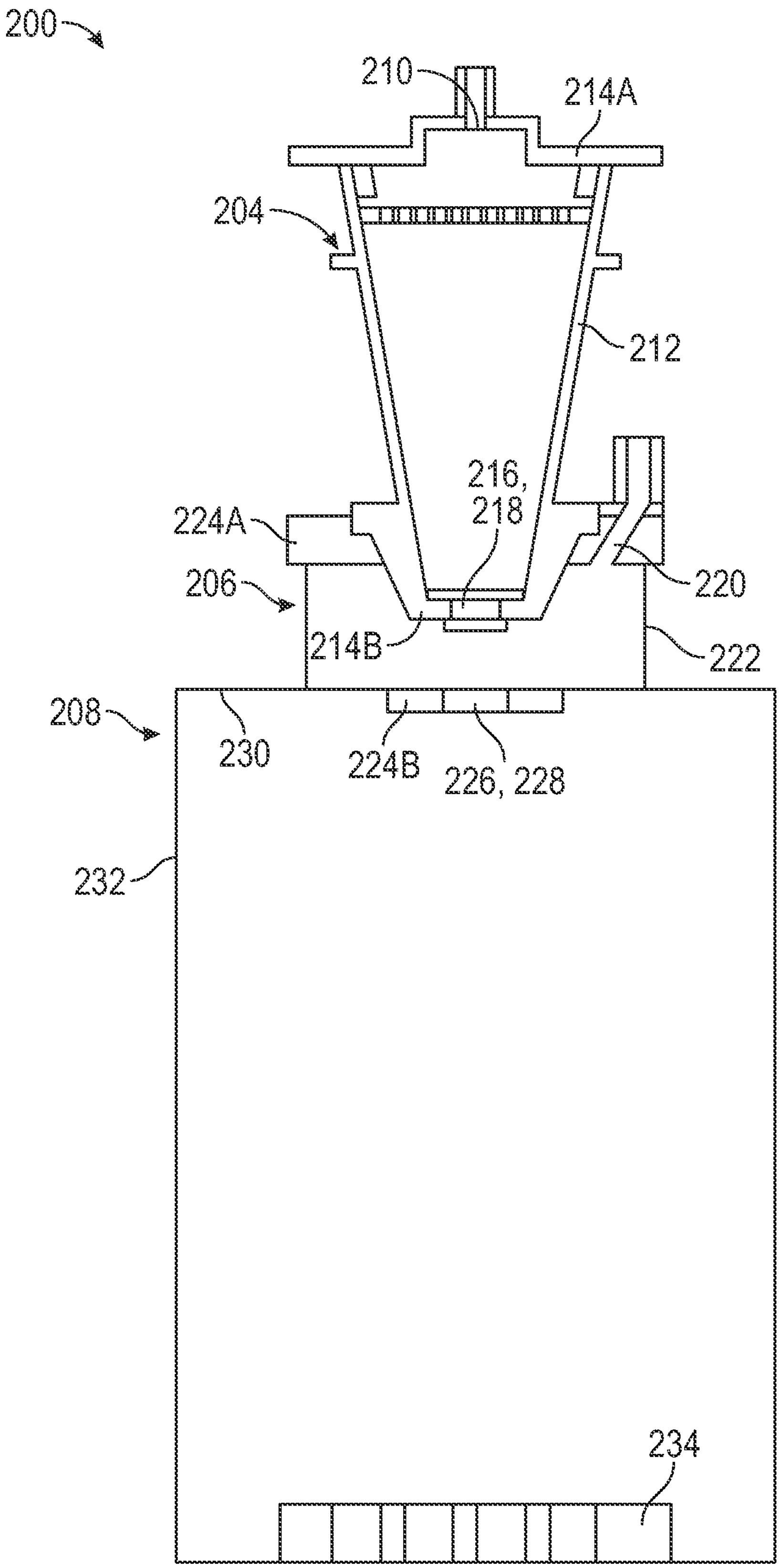
FIG. 3 is a schematic illustration of an apparatus for CVI on a substrate, according to an example of the present disclosure.

FIG. 3 illustrates an example apparatus 200 for depositing a biocompatible material, such as tantalum, on a substrate 102 (e.g., carbon foam, porous metal substrate, etc.). It is understood that the design for the apparatus 200 may vary according to other embodiments. The apparatus 200 includes a first reaction chamber 204 (also called a chlorination chamber herein), a mixing chamber 206 and a second reaction chamber 208. The first reaction chamber 204 can include an inlet 210, side wall 212, end walls 214A and 214B and an outlet 216. The mixing chamber 206 can include a first inlet 218, a second inlet 220, a side wall(s) 222, end walls 224A and 224B and an outlet 226. The second reaction chamber 208 can include an inlet 228, end wall 230, side wall(s) 232 and a pedestal 234.

Figure 4:
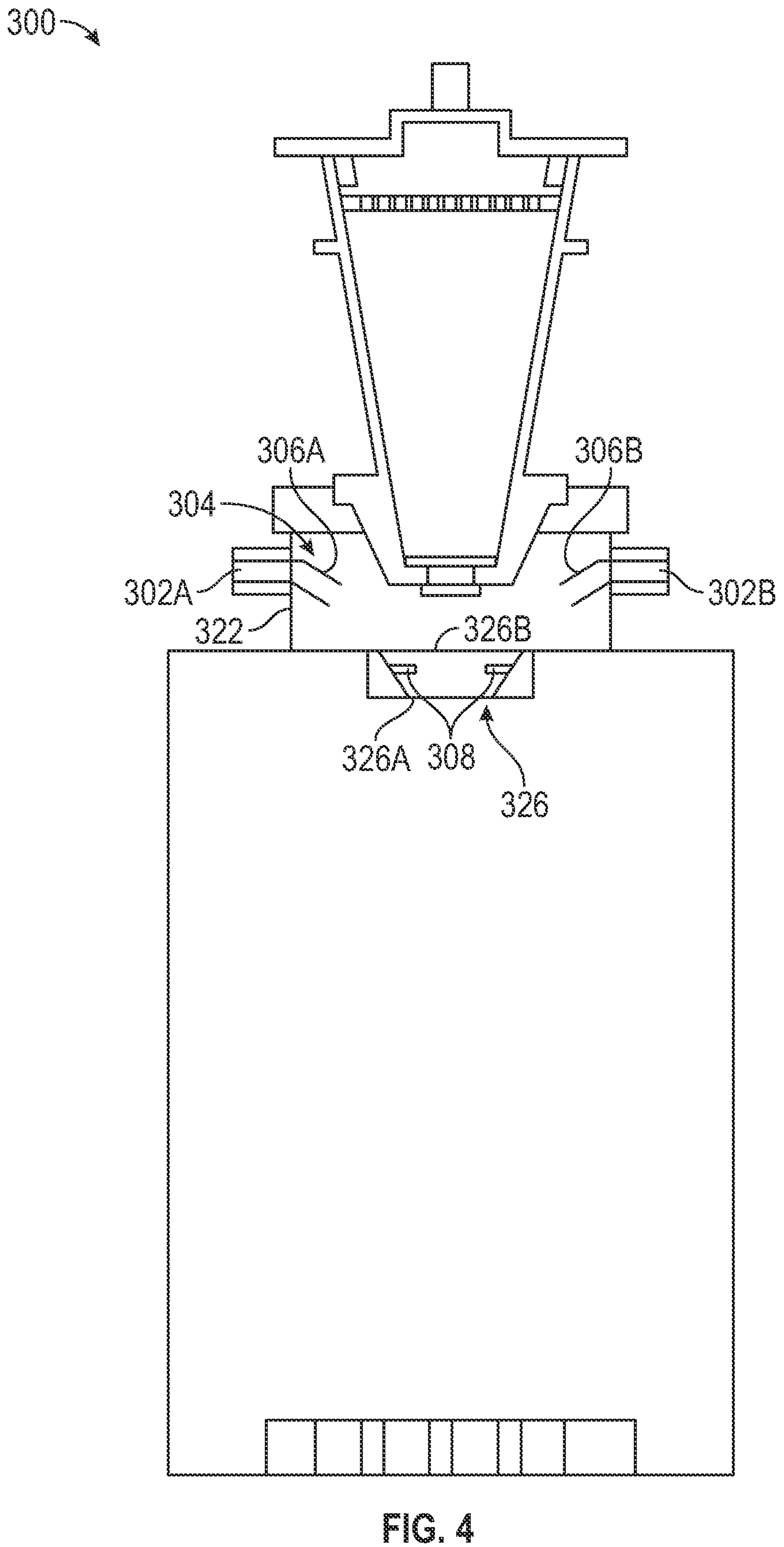
FIG. 4 is a schematic illustration of a second apparatus for CVI on a substrate, according to an example of the present disclosure.
Figure 5:
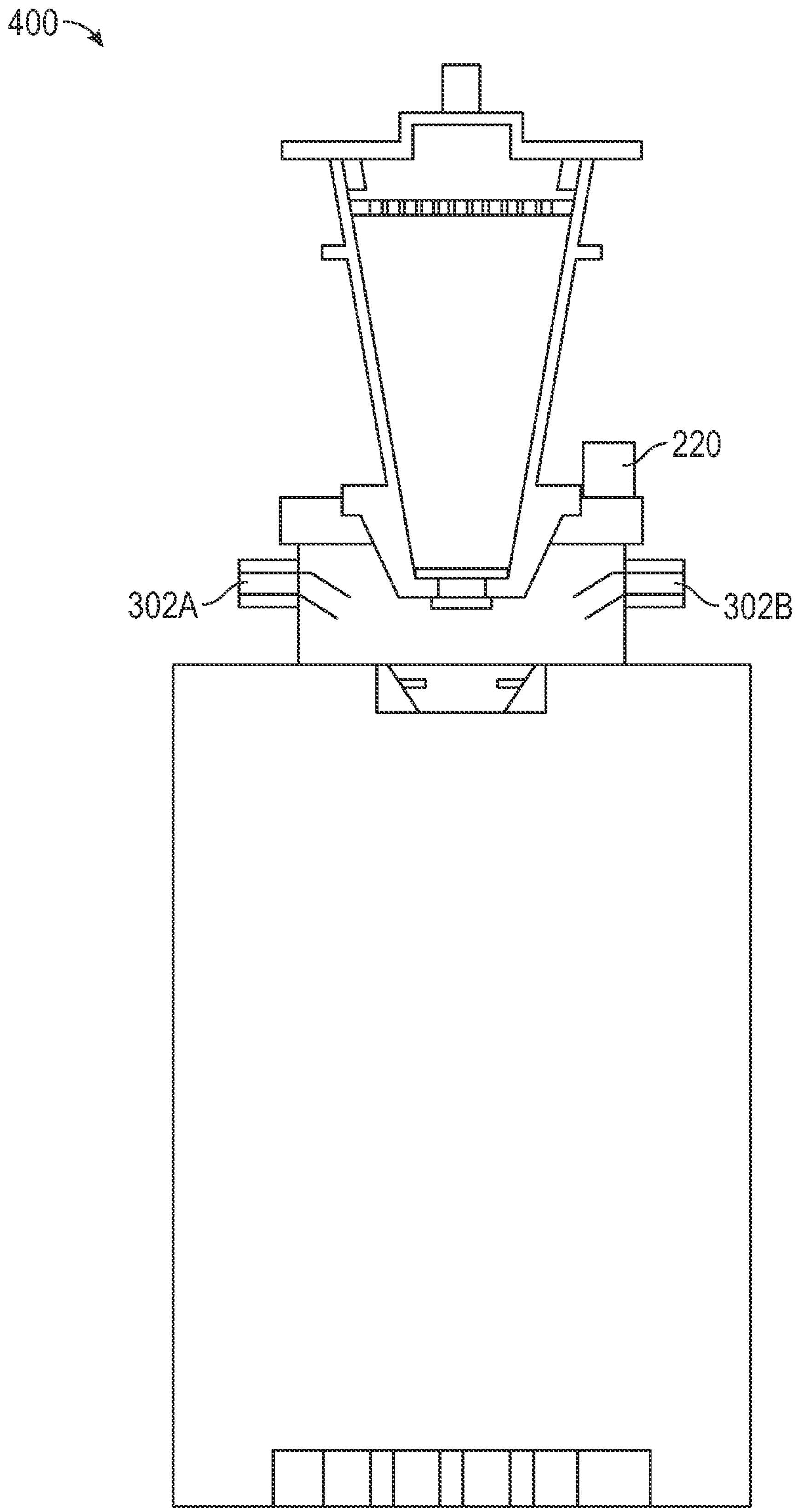
FIG. 5 is a schematic illustration of a third apparatus for CVI on a substrate, according to an example of the present disclosure.

The second reaction chamber 208 includes one or more outlets at a second end generally opposing the end wall 230 and inlet 228 that are not specifically shown in the examples of FIGS. 3-5. Similarly, the substrate 102 (FIG. 1) is not specifically shown in FIGS. 3-5 with the understanding it can be held by the pedestal 234, and indeed, can be stacked as known in the art such as U.S. Pat. Nos. 9,277,998 and 8,956,683.

The first reaction chamber 204 can be in fluid communication with the mixing chamber 206, and the mixing chamber 206 can be in fluid communication with the second reaction chamber 208 as further discussed herein. In the example of FIG. 3, the first reaction chamber 204 can be mounted to and/or can abut the mixing chamber 206. Thus, the outlet 216 of the first reaction chamber 204 can be the first inlet 218. End walls between the first reaction chamber 204 and the mixing chamber 206 can be shared. Similarly, the mixing chamber 206 can be mounted to and/or can abut the second reaction chamber 208 such that the outlet 226 of the mixing chamber 206 can be the inlet 228 of the second reaction chamber 208. End walls between the mixing chamber 206 and the second reaction chamber 208 can be shared. It is recognized that the arrangement as shown in FIG. 3 is purely, exemplary and it is contemplated that one or more of the first reaction chamber 204, the mixing chamber 206 and/or the second reaction chamber 208 can be remote (spaced) from the other components. Tubing, piping or other fluid communication apparatuses could then be utilized such that the outlet 216 can be distinct from the first inlet 218, end walls can be spaced, etc. according to some examples.

As shown in FIG. 3, the first reaction chamber 204 can utilize a first precursor gas such as $Cl_2$. This first precursor gas can enter the first reaction chamber 204 through the inlet 210 that passes through the end wall 214A. As used herein, the terms "inlet" and "outlet" can be a single inlet or single outlet but can also be a plurality of inlets or plurality of outlets unless otherwise specified. Furthermore, a location of the inlet and/or outlet can be modified to another position or can pass through another structure unless otherwise indicated. It is further contemplated herein that one or more exhaust outlets such as in second reaction chamber may be utilized but are not specifically shown. Furthermore, a vacuum or positive pressure differential can be utilized to move the gases through the apparatus 200 as known in the art.

The inlet 210 can pass through the end wall 214A. The end wall 214A can be a top of the apparatus 200 and can be generally opposed by the second end wall 214B and the outlet 216. The outlet 216 can pass through the end wall 214B. The outlet 216 can generally align with the inlet 210. Thus, the inlet 210 and the outlet 216 can generally oppose one another at opposite ends of the first reaction chamber 204. The side wall 212 can extend between the end wall 214A and the end wall 214B.

The side wall 212 and end walls 214A, 214B can be shaped to provide the first reaction chamber 204 with a frustoconical shape having a first cross-sectional area adjacent the outlet 216 that is relatively smaller as compared with a second cross-sectional area adjacent the inlet 210. The interior of the first reaction chamber 204 can be designed as a reservoir for a biocompatible material. Thus, the interior can be configured to hold solid elements such as pellets, nuggets, chunks or scraps of biocompatible material (e.g., tantalum, niobium, tungsten, alloys thereof, etc.). The biocompatible material is not specifically shown in FIG. 3. The frustoconical shape of the first reaction chamber 204 can allow the biocompatible material to settle toward the outlet 216 and can discourage or reduce bridging of the biocompatible material solid elements. Thus, air gaps between the biocompatible material can be reduced. However, the frustoconical shape of the first reaction chamber 204 is exemplary and other shapes are such as cylindrical, cubical, box, etc. are contemplated. Various filters (e.g., porous carbon filters) can be provided within the interior of the first reaction chamber 204 to retain the biocompatible material and perform other functions as known in the art.

As discussed, the first reaction chamber 204 can comprise a chlorination chamber. In some cases, the first reaction chamber 204 can be designed as a hot wall furnace, A resistance heater (not shown) or other type of heating device can surround the first reaction chamber 204, and/or other chambers 206, 208. The heater could also be positioned within the first reaction chamber 204 (and/or other chambers 206, 208) or within the side wall 212 and/or end walls 214A, 214B according to other contemplated examples. The heater can heat the interior of the first reaction chamber 204 to at least 500° C. Side wall 212 and end walls 214A, 214B thus can be constructed of suitable mated al(s) to withstand heating.

The first precursor gas (e.g., chlorine gas) can pass from the inlet 210 over the biocompatible material and can react therewith to form a second precursor gas (e.g., gaseous tantalum pentachloride ($TaCl_5$), gaseous niobium chloride, gaseous tungsten chloride, or gaseous alloys of one or more of tantalum, niobium or tungsten chloride). This second precursor gas can exit the first reaction chamber 204 via the outlet 216.

The first inlet 218 of the mixing chamber 206 can receive the second precursor gas from the first reaction chamber 204. The first inlet 218 can pass through the end wall 224A. The end wall 224A can be a topmost part or adjacent a topmost part of the mixing chamber 206 and can be generally opposed by the second end wall 224B and the outlet 226. Thus, the outlet 226 can generally align with the first inlet 218. The outlet 226 can pass through the end wall 224B. Thus, the first inlet 218 and the outlet 226 can generally oppose one another at opposite ends of the mixing chamber 206. The side wall(s) 222 can extend between the end wall 224A and the end wall 224B.

The second inlet 220 can pass through the end wall 224A but can be offset from the first inlet 218. The second inlet 220 can be located at a topmost part of the mixing chamber 206, for example. Although a single second inlet 220 is shown in FIG. 3, multiple second inlets are contemplated in further embodiments. The second inlet 220 can fluidly communicate and can receive a third precursor gas (e.g., hydrogen ($H_2$)).

The side wall(s) 222 and end walls 224A, 224B can be shaped to provide the mixing chamber 206 any desired shape and size as appropriate Within the interior of the mixing chamber 206, the second precursor gas (e.g., gaseous tantalum pentachloride ($TaCl_5$)) can mix with the third precursor gas (e.g., hydrogen ($H_2$)) so as to become substantially homogenized within the mixing chamber 206. This mixing of the gases may be further facilitated by one or more features as discussed in FIGS. 4-6. However, such features are not necessary to provide for adequate mixing of the second precursor gas and the third precursor gas. The mix of the second precursor gas and the third precursor gas can pass to and through the outlet 226 to the second reaction chamber 208.

The inlet 228 of the second reaction chamber 208 can receive the mix of the second precursor gas and the third precursor gas and pass the mix of the second precursor gas and the third precursor gas into the second reaction chamber 208. The inlet 228 can be through the end wall 230 of the second reaction chamber 208. Side wall(s) 232 extend from the end wall 230 toward a second end wall and/or outlet (not shown). The pedestal 234 can be positioned within an interior of the second reaction chamber 208 such as directly below the inlet 228 and can be configured to hold the substrate 102 (FIG. 1).

The second reaction chamber 208 can be designed as a hot wall furnace with a cylindrical shape. However, other shapes are contemplated. A resistance heater (not shown) or other type of heating device can surround the second reaction chamber 208. The heater could also be positioned within the second reaction chamber 208 or within the side wall(s) 232 and/or end wall 230 according to other contemplated examples. The heater can heat the interior of the second reaction chamber 208 to at least 900° C. in order to drive the deposition reaction between hydrogen gas (example of the third precursor gas), air, and tantalum chloride gas (example of the second precursor gas). The reaction can produce a surface reaction that deposits metal (e.g., Ta) as a coating on the substrate 102 (FIG. 1). If tantalum is utilized, the surface reaction can be characterized by the following formula: $TaCl_5+(5/2)H_2 \rightarrow Ta+5HCl$ (Equation 2 above). In such a reaction, the deposition reaction results in tantalum deposition on the ligaments as a thin film and infiltration into the porous voids of the substrate 102 (FIG. 1). Thus, the porous metal implant 100 of FIG. 1 can be formed. Gaseous hydrogen chloride forms as a byproduct and flows downwardly and from the second reaction chamber 208 via one or more outlets (not shown).

The CVI process and the apparatus 100 may be configured to facilitate adjustment of certain processing parameters, such as time, temperature, gas flow rates, and pressure levels. To determine the effect of varying these parameters, and in order to improve the CVI process, deposition efficiency and weight variance are measured. Deposition efficiency is a process output that determines the percentage of tantalum (or other suitable metal) that successfully deposits onto the substrate 102 (FIG. 1) during one CVI cycle, as is shown in Equation 3 below. The metal source is the amount of biocompatible material that is converted from the solid to gaseous state and flows from the first reaction chamber 204 to the second reaction chamber 208. Deposition efficiency compares the amount of biocompatible material source to the amount of biocompatible material actually deposited on a given substrate (i.e., the amount of gaseous tantalum in the second reaction chamber 208 that reacts with a given substrate 102 and deposits thereon).

$$\text{Deposition Efficiency}=(\text{Material } A_{deposited}/\text{Material } A_{source}) \quad \text{Equation 3}$$

The present inventors have recognized that deposition efficiency can be increased by adequate mixing of the second precursor gas and the third precursor gas prior to entry into the second reaction chamber 208. This mixing is facilitated by the dedicated mixing chamber 206.

It should be noted that increasing the deposition efficiency is not equivalent to increasing the deposition rate. Deposition rate, in contrast to deposition efficiency, is the rate at which tantalum is deposited onto the substrate 102. If tantalum is deposited onto the substrate 102 too rapidly, the tantalum may not effectively infiltrate the pores (not shown) of the substrate 102 and therefore may be thicker and non-uniform on the exterior of the substrate 102 but thinner on the internal ligaments of the substrate 102.

Weight variance (WV) is a process output measuring the variance, or standard deviation squared, in the weight of one of the substrate 102 after one CVI cycle. To determine the change in weight variance, the weight variance of an individual substrate 102 after one CVI cycle is subtracted from the weight variance measured for that same substrate 102 in the subsequent CVI cycle, as is shown in $$\Delta WV=WV_{after}-WV_{before} \quad \text{Equation 4:}$$

Deposition efficiency and weight variance affect the number of CVI cycles that must be performed in order to uniformly coat each substrate 102. Therefore, by decreasing the weight variance and increasing the deposition efficiency, the overall time required to produce a porous metal implant decreases because fewer CVI cycles are needed to form a uniform metal coating on the substrate 102. Additionally, improvements in weight variance and deposition efficiency may eliminate some processing steps, such as rearranging the substrate 102 after each CVI cycle in order to deposit a uniform metal coating onto the substrate 102.

FIG. 4 shows an alternative example of an apparatus 300. The apparatus 300 can have a similar construction to that of the apparatus 200 in most respects. However, the apparatus 300 differs in that a second inlet to a mixing chamber 304 includes a plurality of inlets 302A, 302B through a side wall 322 of the mixing chamber 304 (rather than extending through an end wall as was the case in the example of FIG. 3). Additionally, one or more flow mechanisms 306A, 306B can be provided each in fluid communication with a respective one of the inlets 302A, 302B. The one or more flow mechanisms 306A, 306B can be configured to create a vortex in the flow of the third precursor gas entering the mixing chamber 304. The one or more flow mechanisms 306A, 306B can include angled flow passages, angled flow channels, angled piping, angled tubing or the like. The angle of the one or more flow mechanisms 306A, 306B can produce a flow of the third precursor gas initially along an interior of the side wall 322, for example. Such flow from the one or more flow mechanisms 306A, 306B can be in a same or substantially same direction (e.g., clockwise or counter-clockwise when viewed form above), for example. The vortex created by the one or more flow mechanisms 306A, 306B can facilitate further mixing of the third precursor gas with the second precursor gas.

An outlet 326 of the mixing chamber 304 can be configured to additionally provide for further mixing of the third precursor gas with the second precursor gas. This can be provided by the outlet 326 of the mixing chamber 304 having a flange 308 or other structure. The outlet 326 can further be tapered to have reduced cross-sectional area at an exit 326A of the outlet 326 relative to an entrance 326B of the outlet 326. The flange 308 and/or taper can provide for turbulent flow at the outlet 326 and into the inlet of the second reaction chamber that can further mix the third precursor gas with the second precursor gas.

FIG. 5 shows yet a further example of an apparatus 400. The apparatus 400 is similar to those of apparatuses 200 and 300 in construction. However, the apparatus 400 has a modular design so as to utilize any one or combination of the inlets 302A, 302B and the second inlet 220 for the third precursor gas. The inlets 302A, 302B and the second inlet 220 if not utilized can be selectively closable such as by plugging, disconnection, valve, etc. in any manner known in the art.

Figure 6:
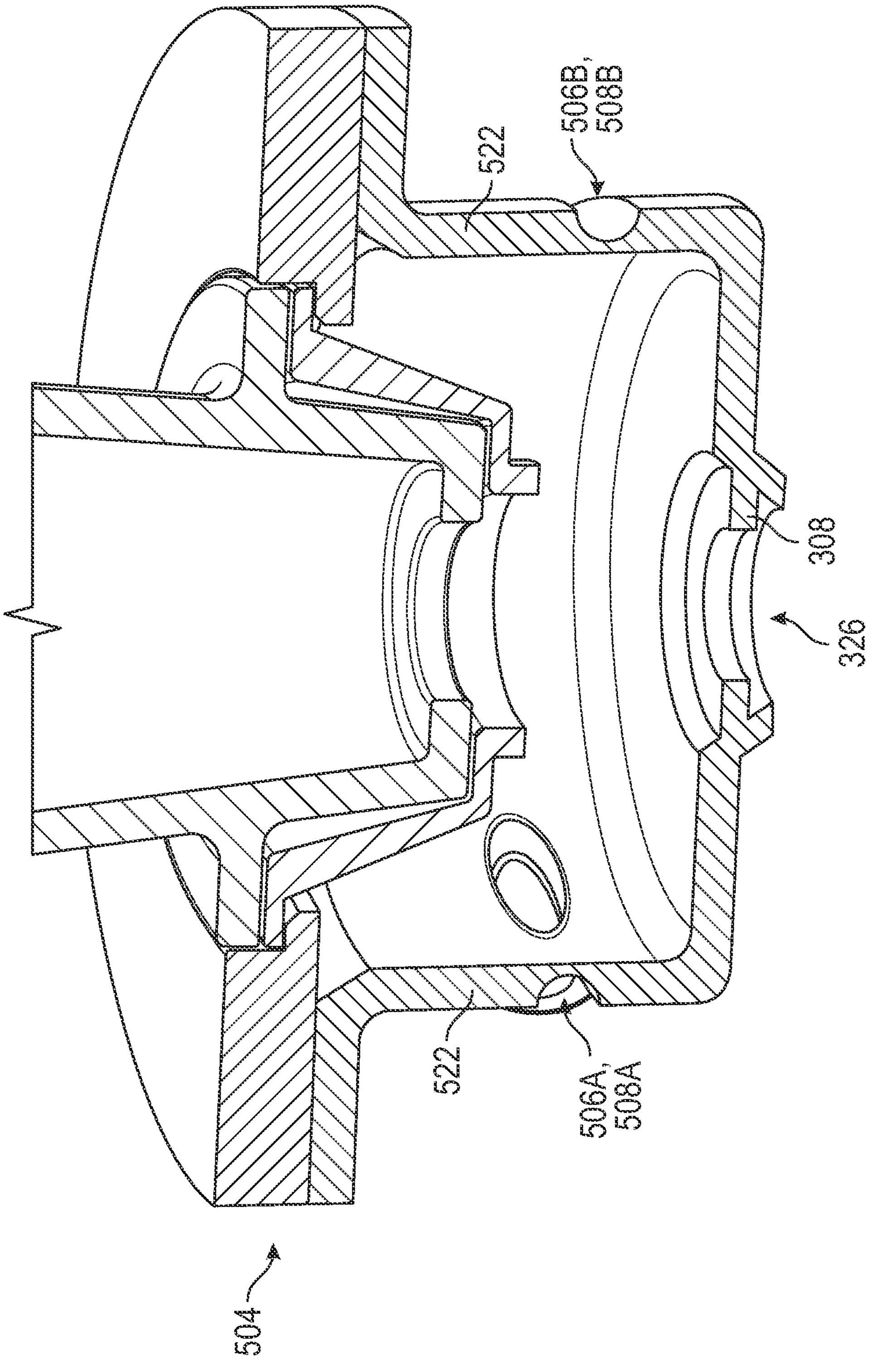
FIG. 6 is an enlarged view of a mixing chamber of a fourth apparatus for CVI, according to an example of the present disclosure.

FIG. 6 shows an enlarged view of an example of one or more flow mechanisms 506A, 506E for inducing a vortex in a mixing chamber 504. The one or more flow mechanisms 506A, 506B comprise angled channels 508A, 508B within, through and along a side wall 522 of the mixing chamber 504. As discussed, the channels 508A, 508B can be angled in a same or substantially same direction (e.g., clockwise or counter-clockwise when viewed form above), for example. The vortex created by the one or more mechanisms 306A, 306B can facilitate further mixing of the third precursor gas with the second precursor gas. The angulation can produce a flow of the third precursor gas initially along an interior of the side wall 522, for example. FIG. 6 also shows an example of the flange 308 at the outlet 326.

Figure 7:
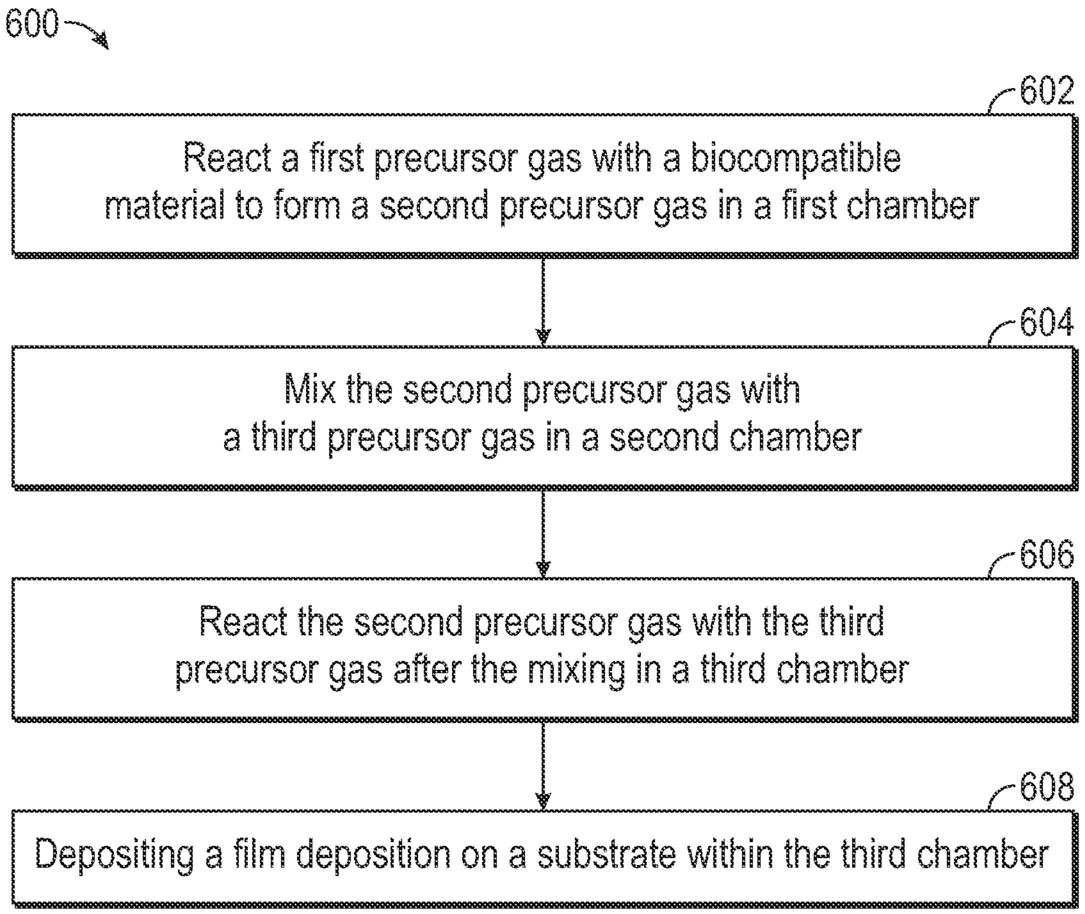
FIG. 7 is a method according to an example of the present disclosure.

FIG. 7 illustrates a chemical vapor deposition method 600 according to one example. The method can include reacting 602 a first precursor gas with a biocompatible material to form a second precursor gas in a first chamber. The method 600 can include mixing 604 the second precursor gas with a third precursor gas in a second chamber. The method can include reacting 606 the second precursor gas with the third precursor gas after the mixing in a third chamber. The method 600 can include depositing 608 a film deposition on a substrate within the third chamber as a result of the reacting the second precursor gas with the third precursor gas.

The method 600 can optionally include the substrate comprises a reticulated carbon foam or porous metal structure having a porosity of between 55% and 90%. The second precursor gas can include a tantalum or tantalum alloy. The mixing the second precursor gas with the third precursor gas can include creating a vortex of a flow of the third precursor gas upon entry into the second chamber. The mixing the second precursor gas with the third precursor gas can include passing the second precursor gas and the third precursor gas through one or more a turbulent flow inducing structures at an outlet from the second mixing chamber. The mixing the second precursor gas with the third precursor gas can include passing the third precursor gas through one or more inlets through a side wall of the second chamber.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls. In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. 11*t* is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus for use in a chemical vapor infiltration process, the apparatus comprising:

a first reaction chamber having an inlet configured to receive a first gas and an outlet therefrom for a second gas reacted in the first reaction chamber;

a mixing chamber separate from the first reaction chamber, the mixing chamber having an inlet in fluid communication with the outlet of the first reaction chamber, the mixing chamber having one or more second inlets thereto configured to receive a third gas, the mixing chamber has an outlet therefrom; and a second reaction chamber separate from the mixing chamber and the first reaction chamber, the second reaction chamber having an inlet in fluid communication with the outlet of the mixing chamber to receive a mixture of the second gas and the third gas therein, the second reaction chamber is configured to hold a substrate therein that is coated by reaction of the second gas and the third gas within the second reaction chamber;

wherein the first reaction chamber has a frustoconical shape with a first cross-sectional area adjacent the outlet of the first reaction chamber that is relatively smaller as compared with a second cross-sectional area adjacent the inlet of the first reaction chamber.

2. The apparatus of claim 1, wherein the one or more second inlets of the mixing chamber include one or more inlets through a side wall of the mixing chamber and/or one or more inlets through an end wall of the mixing chamber.

3. The apparatus of claim 1, wherein the one or more second inlets of the mixing chamber include one or more inlets through a side wall of the mixing chamber, and wherein the mixing chamber includes one or more vortex inducing features therein in fluid communication with the one or more inlets through the side wall of the mixing chamber.

4. The apparatus of claim 1, wherein the one or more second inlets of the mixing chamber include one or more inlets through a side wall of the mixing chamber, wherein the mixing chamber includes one or more vortex inducing features therein in fluid communication with the one or more inlets through the side wall of the mixing chamber, and wherein an interior of the side wall of the mixing chamber includes the one or more vortex inducing features.

5. The apparatus of claim 1, wherein the one or more second inlets of the mixing chamber include one or more inlets through a side wall of the mixing chamber and one or more inlets through an end wall of the mixing chamber, and wherein the one or more inlets through the side wall of the mixing chamber and one or more inlets through the end wall of the mixing chamber are selectively closeable.

6. The apparatus of claim 1, wherein the outlet of the mixing chamber has a flange and is tapered to have reduced cross-sectional area at an exit of the outlet of the mixing chamber.

7. An apparatus for use in a chemical vapor infiltration process, the apparatus comprising:

a first reaction chamber configured to receive a first precursor gas and hold a biocompatible material, wherein the first precursor gas and the biocompatible material react within the first reaction chamber to form a second precursor gas;

a mixing chamber separate from the first reaction chamber, the mixing chamber having at least a first inlet, a second inlet and an outlet, wherein the first inlet is in fluid communication with the first reaction chamber to receive the second precursor gas from the first reaction chamber and the second inlet is in fluid communication to receive a third precursor gas, wherein the second precursor gas and the third precursor gas mix within the mixing chamber before passing to the outlet; and a second reaction chamber separate from the mixing chamber and the first reaction chamber, the second reaction chamber, the second reaction chamber configured to receive the second precursor gas and the third precursor gas mix and having a pedestal to hold a substrate therein, wherein the substrate receives a film deposition from reaction of the second precursor gas and the third precursor gas within the second reaction chamber;

wherein the second inlet includes one or more inlets through a side wall of the mixing chamber and/or one or more inlets through an end wall of the mixing chamber.

8. The apparatus of claim 7, wherein the mixing chamber adjacent the outlet is tapered with a flange and has a first cross-sectional area at an exit of the outlet that is relatively smaller than a second cross-sectional area spaced from the exit.

9. The apparatus of claim 7, wherein the first reaction chamber has a frustoconical shape with a first cross-sectional area adjacent an outlet that is relatively smaller as compared with a second cross-sectional area adjacent an inlet.

10. The apparatus of claim 7, wherein the substrate comprises a reticulated carbon foam or porous metal.

11. The apparatus of claim 7, wherein the second precursor gas includes a tantalum or tantalum alloy.

12. An apparatus for use in a chemical vapor infiltration process, the apparatus comprising:

a first reaction chamber configured to receive a first precursor gas and hold a biocompatible material, wherein the first precursor gas and the biocompatible material react within the first reaction chamber to form a second precursor gas;

a mixing chamber having at least a first inlet, a second inlet and an outlet, wherein the first inlet is in fluid communication with the first reaction chamber to receive the second precursor gas from the first reaction chamber and the second inlet is in fluid communication to receive a third precursor gas, wherein the second precursor gas and the third precursor gas mix within the mixing chamber before passing to the outlet; and a second reaction chamber configured to receive the second precursor gas and the third precursor gas mix and having a pedestal to hold a substrate therein, wherein the substrate receives a film deposition from reaction of the second precursor gas and the third precursor gas within the second reaction chamber;

wherein the second inlet includes one or more inlets through a side wall of the mixing chamber, and wherein the mixing chamber includes one or more vortex inducing features therein in fluid communication with the one or more inlets through the side wall of the mixing chamber.

* * * * *